(12) United States Patent
Kuo (10) Patent No.: US 7,793,199 B2
(45) Date of Patent: Sep. 7, 2010

(54) METHOD FOR REDUCING THE COMPUTATIONAL COMPLEXITY OF VITERBI DECODER

(75) Inventor: Tsung-Sheng Kuo, Taipei (TW)

(73) Assignee: Tatung Company, Taipei (TW)

(*) Notice: Subject to any disclaimer, the term of this patent is extended or adjusted under 35 U.S.C. 154(b) by 1015 days.

(21) Appl. No.: 11/527,630

(22) Filed: Sep. 27, 2006

(65) Prior Publication Data

US 2007/0101245 A1 May 3, 2007

(30) Foreign Application Priority Data

Oct. 17, 2005 (TW) .............................. 94136183 A (51) Int. Cl.
*H03M 13/03* (2006.01)
(52) U.S. Cl. .................... 714/786; 714/791; 714/795
(58) Field of Classification Search ............... 714/786, 714/791, 794, 792, 795, 796
See application file for complete search history.

(56) References Cited

U.S. PATENT DOCUMENTS

| 6,603,412 B2 * | 8/2003 | Gatherer et al. ................ 341/61 |
| 6,690,750 B1 * | 2/2004 | Hocevar et al. ............. 375/341 |
| 7,394,755 B2 * | 7/2008 | Nishijima et al. ........... 370/210 |

OTHER PUBLICATIONS

Hui-Ling Lou, "Implementing the Viterbi Algorithm", IEEE Signal Processing Magazine, Sep. 1995, pp. 42-52.
Ming-Der Shieh et al., "Design and Implementation of a DAB Channel Decoder", IEEE Transactions on Consumber Electronics, vol. 45, No. 3, Aug. 1999, pp. 553-562.

* cited by examiner

*Primary Examiner*—Fritz Alphonse
(74) *Attorney, Agent, or Firm*—Bacon & Thomas, PLLC (57) ABSTRACT

A method for reducing the computational complexity of a Viterbi decoder, which is suitable for all code rates of a convolutional code applied by the Viterbi decoder. The method dramatically reduces the branch metric computation to thus reduce the complexity of implementing the Viterbi decoder, without affecting the capability of error correction. Upon the best mode, the Viterbi decoder can reduce the required branch metric computation to $1/4^k$ of the original computation.

2 Claims, 10 Drawing Sheets

| $g_r$ | $g_{k+v-r+1}$ | Symmetries in the butterfly units |
|---|---|---|
| 0 | 0 | $B^1_{k-r} = B^2_{k-r} = B^3_{k-r} = B^4_{k-r}$ |
| 1 | 0 | $B^1_{k-r} = B^{2'}_{k-r} = B^3_{k-r} = B^{4'}_{k-r}$ |
| 0 | 1 | $B^1_{k-r} = B^2_{k-r} = B^{3'}_{k-r} = B^{4'}_{k-r}$ |
| 1 | 1 | $B^1_{k-r} = B^{2'}_{k-r} = B^{3'}_{k-r} = B^4_{k-r}$ |

METHOD FOR REDUCING THE COMPUTATIONAL COMPLEXITY OF VITERBI DECODER

BACKGROUND OF THE INVENTION

1. Field of the Invention

The invention relates to a method for reducing the computational complexity of a Viterbi decoder and, more particularly, to a method for reducing the computational complexity of a Viterbi decoder at all code rates of a convolutional code.

2. Description of Related Art

In current communication systems, a transmitter transmits a radio signal to a remote receiver. When the radio signal passes through a wireless channel so as to cause a fading and result in errors. Accordingly, the transmitted signal is typically performed with a convolutional encoding before being modulated to the RF signal. After demodulating the received radio signal, the remote receiver performs the convolutional decoding to thereby reconstruct the transmitted signal. Such a way can reduce the channel fading effect and noise interference. The convolutional encoding is referred to as a channel encoding, which is performed by a channel encoder. In general, a convolutional code has three parameters: the number of input bits k, the number of output bits n, and constraint length. The input and output bit parameters k and n are typically represented by the code rate k/n, where k, n are a positive integer. The constraint length indicates the number of memory element of the convolutional code. The convolutional decoding uses a Viterbi algorithm in order to provide an optimal coding gain. Therefore, the current communication systems mostly implements the Viterbi decoder to perform the convolutional decoding. The convolutional code can enhance the capability of error correction by increasing the constraint length. However, the decoding computation at the receiving side is increased with the increased constraint length. To overcome this, U.S. Pat. No. 5,539,757 granted to Cox, et al. for an "Error correction systems with modified Viterbi decoding" has disclosed a method to relatively reduce the computation of the Viterbi decoder by efficiently using the relation of the branches. However, the method can be applied only at a specific code rate, 1/n, which cannot satisfy a user with a desire for a code rate k/n other than the code rate 1/n.

SUMMARY OF THE INVENTION

The object of the invention is to provide a method for reducing the computational complexity of a Viterbi decoder, which can be used in the Viterbi decoder at all code rates of a convolutional code and effectively reduce the computation required for a convolutional decoding.

To achieve the object, there is provided a method for reducing the computational complexity of a Viterbi decoder. The method comprises the steps of: (A) decomposing a trellis diagram with a convolutional code at a code rate k/n into $2^{v-k}$ radix-$2^k$ butterfly units, where k, n, v are a positive integer, and k indicates a number of input bits, n indicates a number of output bits, and v indicates a constraint length; (B) decomposing each radix-$2^{k-r}$ butterfly unit into four radix-$2^{k-r-1}$ butterfly units; (C) determining a branch symmetry among the radix-$2^{k-r-1}$ butterfly units based on a generator sequence for the convolutional code; (D) determining if r is equal to k, and when r is not equal to k, adding r by one and executing step (B); and (E) using the branch symmetry to reduce a branch metric computation required by a convolutional decoding at the code rate k/n.

Other objects, advantages, and novel features of the invention will become more apparent from the following detailed description when taken in conjunction with the accompanying drawings.

DETAILED DESCRIPTION OF THE PREFERRED EMBODIMENT

The method for reducing the computational complexity of a Viterbi decoder, which is suitable for all code rates of a convolutional code which is decoded by the Viterbi decoder. The method uses the butterfly structure to gather the corresponding branches in the trellis diagram to a same butterfly unit, and finds the symmetries of all branches in the trellis diagram in accordance with the generator sequence. Accordingly, the branch metric values for partial branches are required in computation, and the remainders can be obtained in accordance with the branch symmetries. Thus, the reduced computation is achieved. Upon the best mode as using the method, the Viterbi decoder can reduce the required branch metric computation to $1/4^k$ of the original computation.

Figure 1:
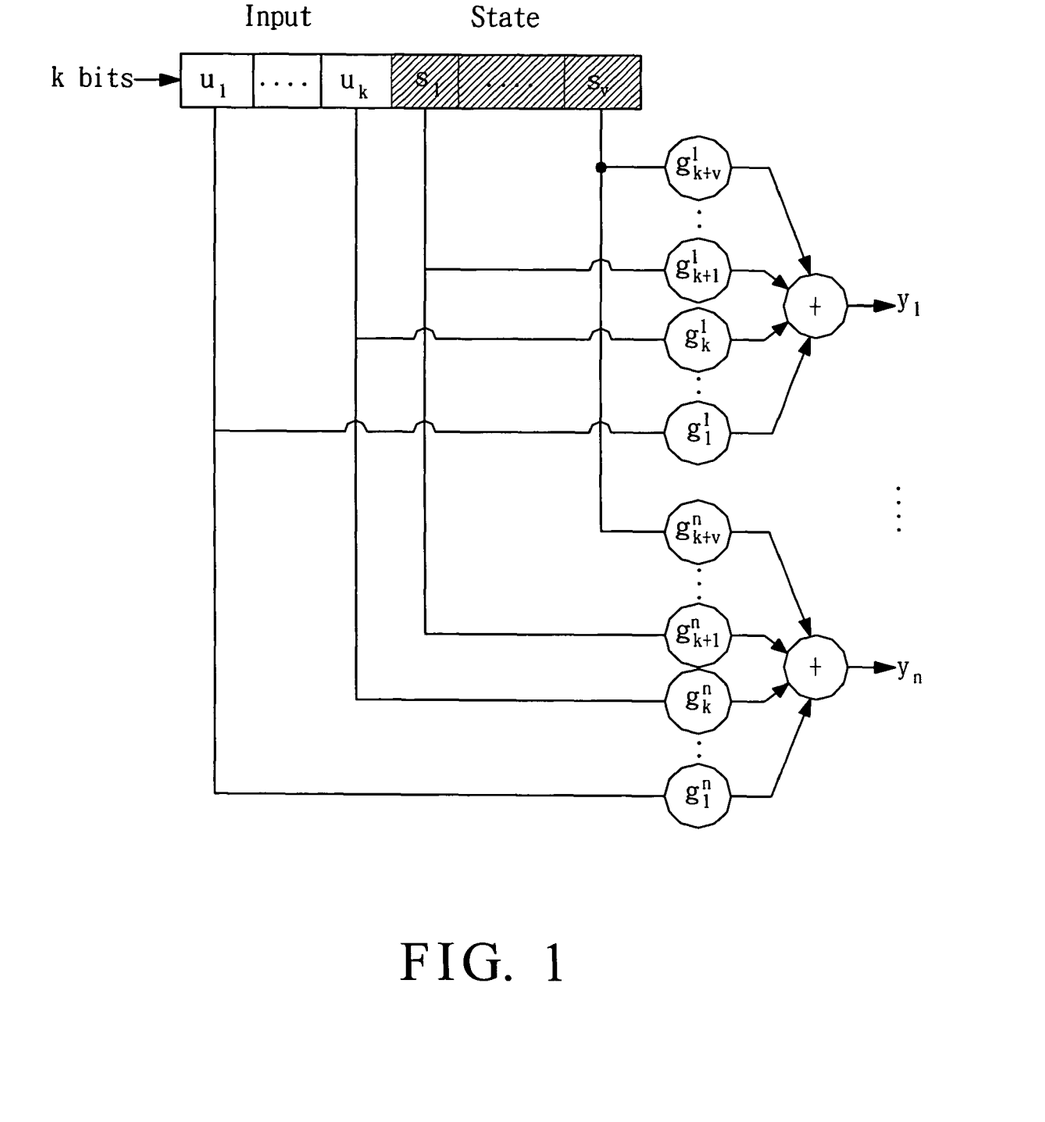
FIG. 1 is a schematic diagram of a convolutional encoder with a convolutional code at a code rate k/n in accordance with the invention.

As shown in FIG. 1, the encoder with the convolutional code at the code rate k/n has k+v registers, for v is a positive integer and indicates the constraint length or the number of state bits. In a unit of time, the k bits input data denoted by $u_1 u_2 \ldots u_k$ are input to the encoder. There are n modulo-2 adders to generate n output bits $y_1 y_2 \ldots y_n$. In this case, the relation between the input bit and the output bit is determined by the generators. If the generator for the i-th output bit $y_i$ is $g^i = [g_1^i\ g_2^i\ \ldots\ g_{k+v}^i]$, the i-th output bit $y_i$ can be defined by the following equation:

$$y_i = g_1^i \cdot u_1 \oplus \ldots \oplus g_k^i \cdot u_k \oplus g_{k+1}^i \cdot s_1 \oplus \ldots \oplus g_{k+v}^i \cdot s_v, \quad (1)$$

where i is a positive integer smaller than or equal to n, and ⊕ indicates a modulo-2 adder.

Figure 2:
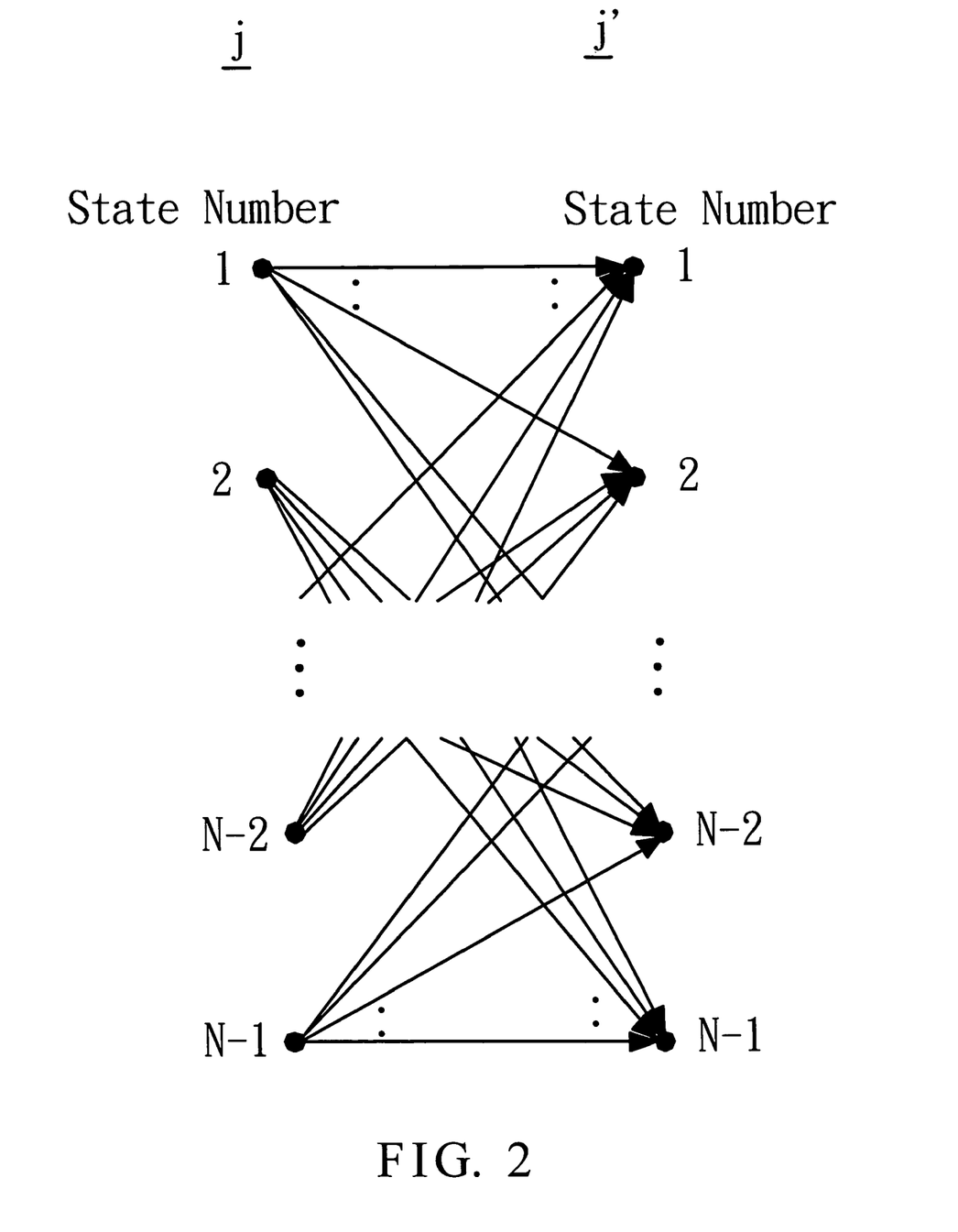
FIG. 2 is a trellis diagram of a convolutional code at a code rate k/n in accordance with the invention.

In addition, a trellis diagram is another approach that is commonly used to show the convolutional code with the code rate k/n. In the trellis diagram, each branch shows a set of output bits, and each state is defined by referring to the state bits in the register, which is represented by the following equation:

$$S = s_1 s_2 \ldots s_{v-1} s_v. \qquad (2)$$

As shown in FIG. 2, the trellis diagram in each stage has $N=2^v$ state values, and the states are numbered in decimal, where $s_v$ indicates a most significant bit (MSB) while $s_1$ indicates a least significant bit (LSB). If notation j indicates the current stage state set containing the states numbered 1 to N, state j' indicates a next stage state set with respect to the current stage state set j, and the sets j and j' have an N state respectively. The oldest k input bits are removed from the registers as k input bits enter in the registers every time, thereby generating a state transition, i.e., the state is changed from the state denoted as $s_1 s_2 \ldots s_v$ of the set j into the state denoted as $u_1 \ldots u_k s_1 \ldots s_{v-k}$ of the set j'. As shown in FIG. 2, each state has $2^k$ state transitions, and each transition has a corresponding branch. Accordingly, for a Viterbi decoding, each set has $2^{v+k}$ branch metric values to be computed. However, the number to be computed presents an exponential growth as the constraint length v is increased. To overcome this, the invention finds the branch symmetries of the branches in the trellis diagram to thereby simplify the computation and achieve the purpose of reducing the computational amount required for the Viterbi decoding.

Because an effective approach to find the symmetries of the branches in the trellis diagram does not exist, the invention discloses a butterfly structure to overcome the aforementioned problem.

Referring again to FIG. 2, it is observed that the $2^k$ branches emitted from a same source state have a certain relation because the content of the register for the $2^k$ branches emitted is determined only by the different input bits, i.e., the relation of the branches can be found from the bits $u_1 \ldots u_k$. In addition, the $2^k$ branches entering in a same destination state also have a certain relation because the content of the register for the $2^k$ branches is determined only by the bits $s_{v-k+1} \ldots s_v$ of the source states, i.e., the relation of the branches can be determined by the bits of the source states.

Figure 3:
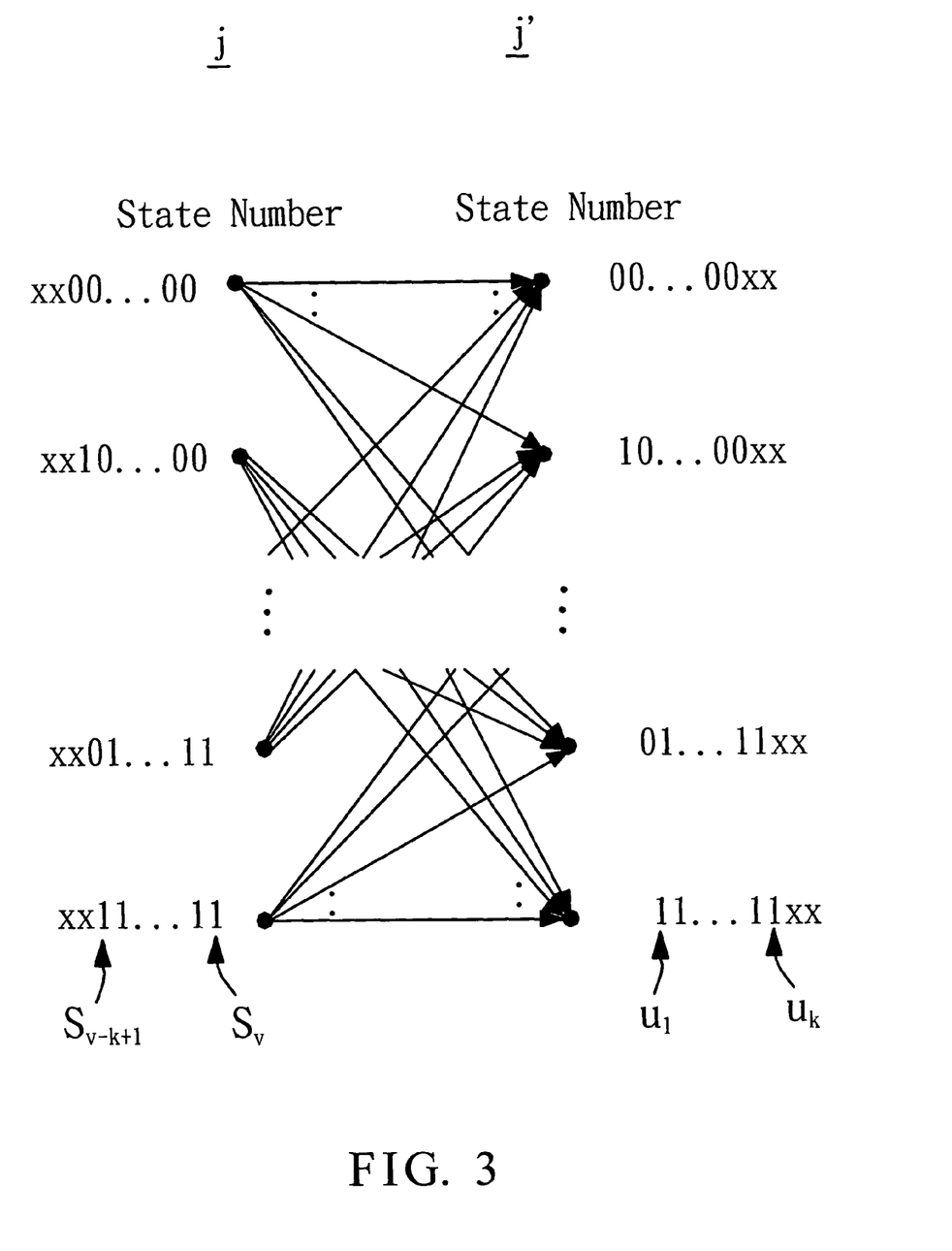
FIG. 3 is a diagram of radix-$2^k$ butterfly units in accordance with the invention.

All relative states and branches are collected to form a butterfly unit, as shown in FIG. 3. Namely, the trellis diagram of FIG. 2 can be decomposed into $2^{v-k}$ butterfly units. The butterfly unit shown in FIG. 3 is defined as a radix-$2^k$ butterfly unit that has $2^k$ states. Each of the $2^k$ states is joining $2^k$ branches.

All states in the radix-$2^k$ butterfly unit have the same bits $s_1 \ldots s_{v-k}$, which is notated by xx in the figures for the convenience. Accordingly, equation (1) can be rewritten into:

$$y_i = g_1^i \cdot u_1 \oplus g_2^i \cdot u_2 \oplus \Lambda \oplus g_k^i \cdot u_k \oplus X_i \oplus g_{v+1}^i \cdot s_{v-k+1} \oplus \Lambda \\ \oplus g_{k+v}^i \cdot s_v, \qquad (3)$$

where $X_i$ is generated from the same portion $s_1 \ldots s_{v-k}$, i.e., the same component presented in every branch, $$X_i = g_{k+1}^i \cdot s_1 \oplus g_{k+2}^i \cdot s_2 \oplus \Lambda \oplus g_v^i \cdot s_{v-k}. \qquad (4)$$

Therefore, upon the relation of the branches of FIG. 3, the trellis diagram of FIG. 2 can be decomposed into $2^{v-k}$ radix-$2^k$ butterfly units. Namely, the corresponding branches are all gathered to a same radix-$2^k$ butterfly unit, and the branch symmetry is obtained by referring to the states joining the branches in every radix-$2^k$ butterfly unit. The relation of the branches is not affected because $X_i$ indicates the same portion of the bits in every branch. From equation (3), it can show that the relation of the branches is influenced only by the 2k members, $g_1^i, g_2^i \Lambda g_k^i, g_{v+1}^i, g_{v+2}^i \Lambda g_{k+v}^i$, in the generator. Namely, for every bit on the branches, there are $2^{2k}$ symmetries in total. Because a branch symmetry is obtained from the intersection of bit symmetries, a great number of bit symmetries can cause the difficulty of obtaining the branch symmetry. The invention can continuously and regularly decompose a radix-$2^k$ butterfly unit in every level to thereby reduce the influence of the generator on the branch symmetries in the butterfly unit.

Figure 4A:
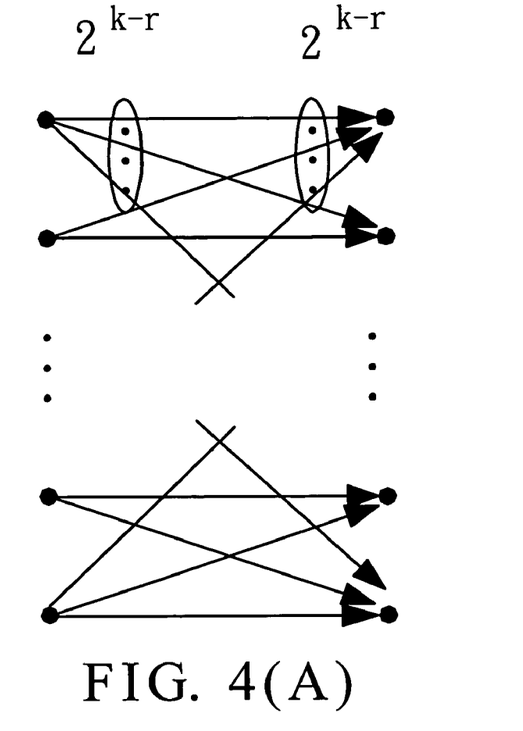
FIGS. 4(A) and (B) are original and simplified diagrams of a radix-$2^{k-r}$ butterfly unit in the rth level in accordance with the invention.
Figure 4B:
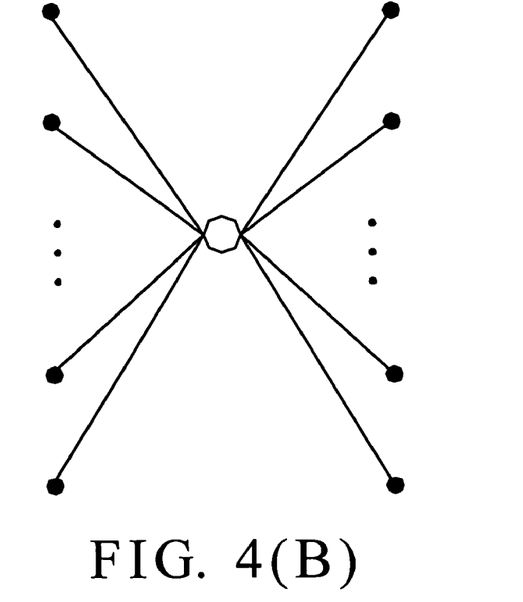

In order to simplify the following illustrations, the butterfly unit in every level is illustrated by a simplified diagram. FIGS. 4(A) and (B) show original and simplified diagrams of a radix-$2^{k-r}$ butterfly unit in the r-th level. As shown in FIG. 4(A), each of the radix-$2^{k-r}$ butterfly units in the r-th level has $2^{k-r}$ states, and each state joins $2^{k-r}$ branches. The butterfly unit in every level hereinafter is illustrated in a simplified form.

Figure 5:
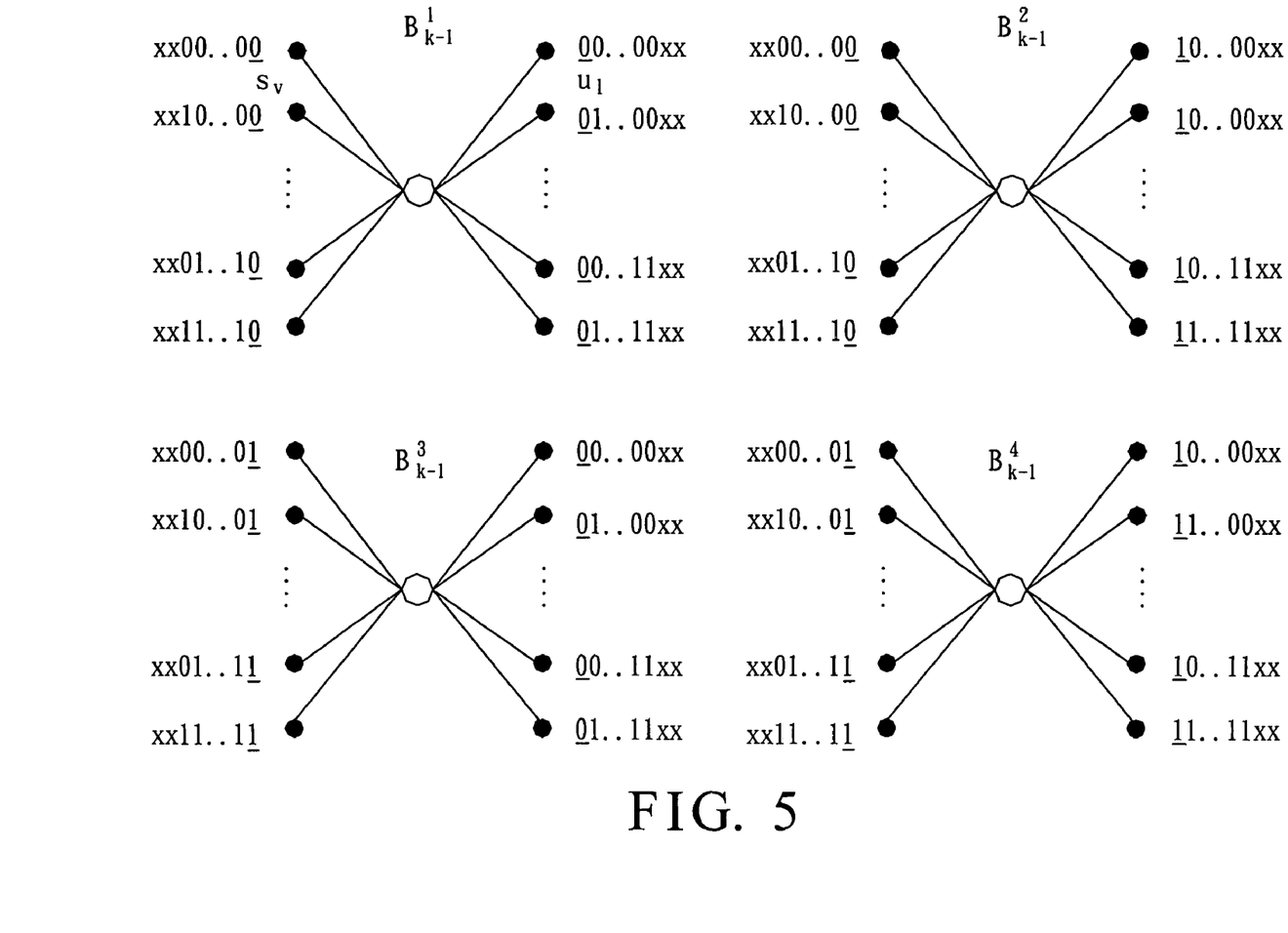
FIG. 5 is a schematic diagram of four radix-$2^{k-1}$ butterfly units in the first level in accordance with the invention.

First decomposition divides the radix-$2^k$ butterfly unit into four radix-$2^{k-1}$ butterfly units based on the bits ($u_1, s_v$) of the states in the radix-$2^k$ butterfly unit, and distributes all branches, which are the same at the bits ($u_1, s_v$) in the states, to a same radix-$2^{k-1}$ butterfly unit. As shown in FIG. 5, the branch relation in a same radix-$2^{k-1}$ butterfly unit is not influenced by the bits ($u_1, s_v$). In addition, the states joining the branches among the four radix-$2^{k-1}$ butterfly units are the same except at the bits ($u_1, s_v$), and thus the relation of the branches of the four radix-$2^{k-1}$ butterfly units is determined only by the bits ($u_1, s_v$). Besides, the symmetry type of the four radix-$2^{k-1}$ butterfly units is influenced only by the members ($g_1^i, g_{k+v}^i$) of the generators that are mapped by the bits ($u_1, s_v$). For example, if $g_1^i = 0$ and $g_{k+v}^i = 0$, the symmetry of the four radix-$2^{k-1}$ butterfly units is $B^1_{k-1} = B^2_{k-1} = B^3_{k-1} = B^4_{k-1}$. If $g_1^i = 0$ and $g_{k+v}^i = 1$, the symmetry of the four radix-$2^{k-1}$ butterfly units is $B^1_{k-1} = B^2_{k-1} = B^3_{k-1}' = B^4_{k-1}'$, for $B^3_{k-1}'$ and $B^3_{k-1}$ are complementary, and $B^4_{k-1}'$ and $B^4_{k-1}$ are complementary.

Figure 6:
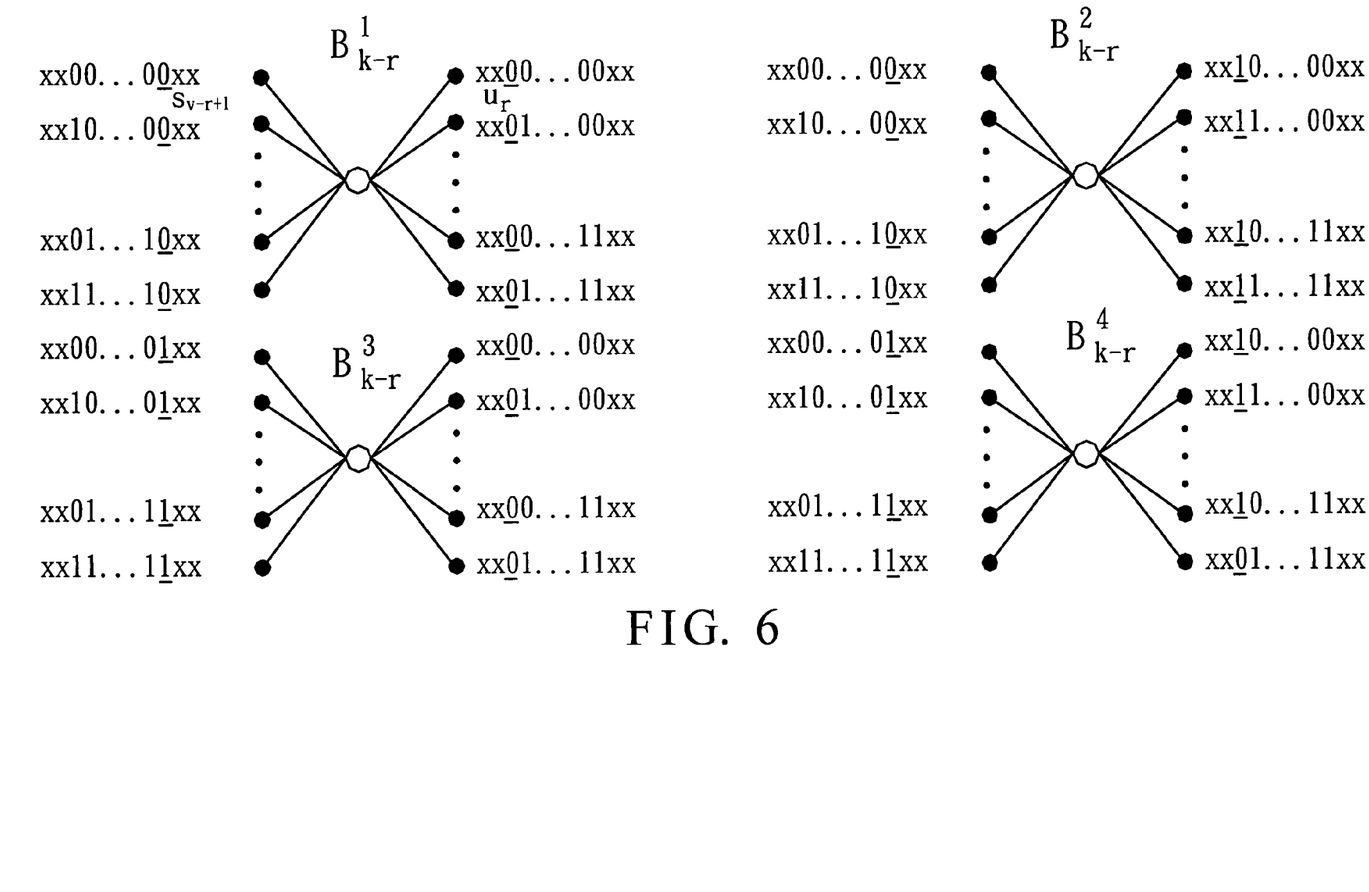
FIG. 6 is a schematic diagram of four radix-$2^{k-r}$ butterfly units in the rth level in accordance with the invention.
Figure 7:
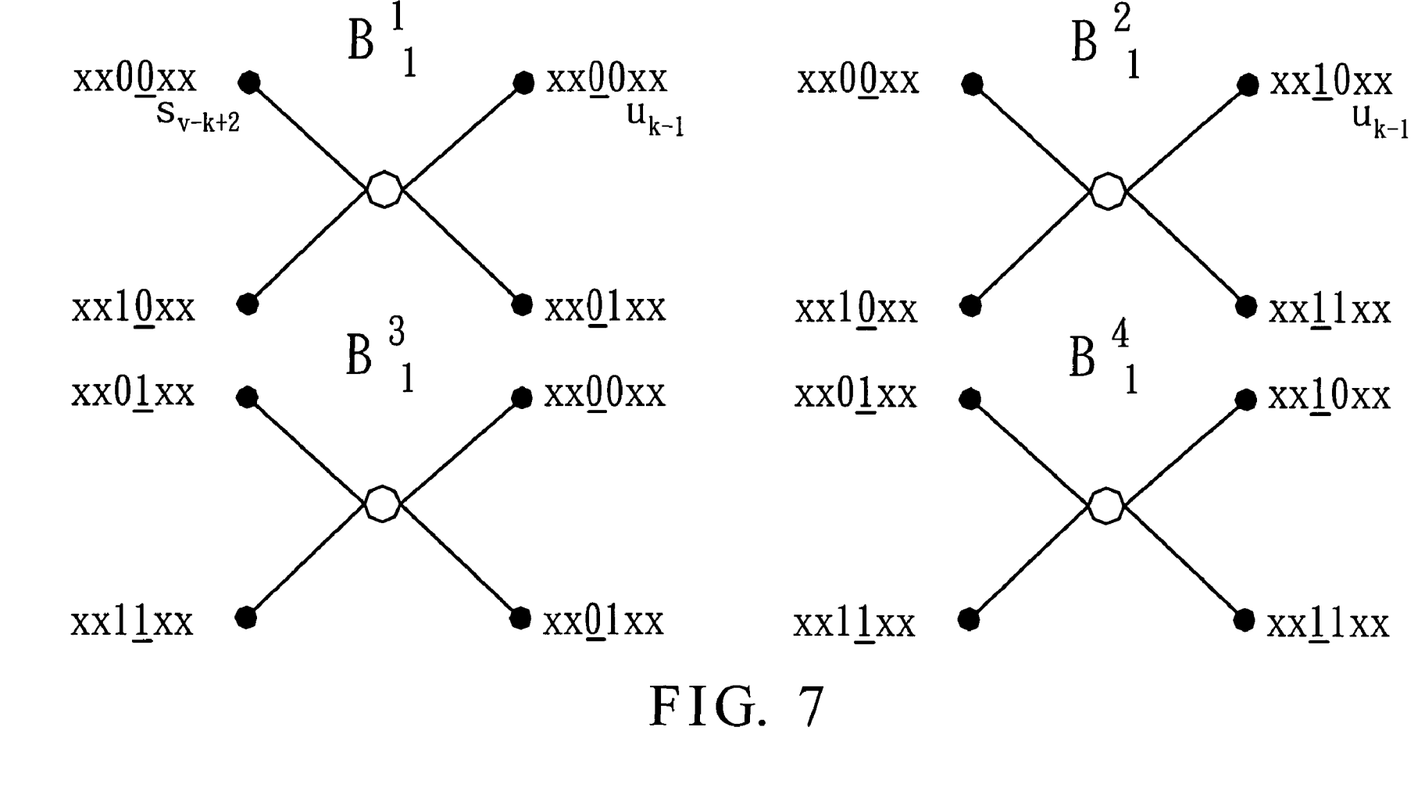
FIG. 7 is a schematic diagram of four radix-$2^1$ butterfly units in the (k−1)th level in accordance with the invention.
Figure 8:
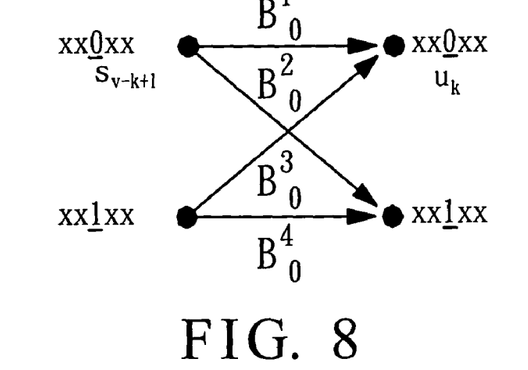
FIG. 8 is a schematic diagram of one radix-$2^1$ butterfly unit in accordance with the invention.

Similarly, for a butterfly unit in the r-th level, a radix-$2^{k-r+1}$ butterfly unit is decomposed into four radix-$2^{k-r}$ butterfly units by settling the bits ($u_1, s_{v-r+1}$) of the states, as shown in FIG. 6. In addition, the relation of the four radix-$2^{k-r}$ butterfly units is determined by the members ($g_r^i, g_{k+v-r+1}^i$) of the generators. Accordingly, a last radix-$2^2$ butterfly unit is decomposed into four radix-$2^1$ butterfly units, as shown in FIG. 7, and the relation of the four radix-$2^1$ butterfly units is determined by the members ($g_{k-1}^i, g_{k+v+2}^i$). Finally, as shown in FIG. 8, each of the four radix-$2^1$ butterfly units remains only four branches, and the states joining the four branches are different only at the bits ($u_k, s_{v-k+1}$). Therefore, the relation of the four branches can be determined by the members ($g_k^i, g_{v+1}^i$) of the generators.

Figure 9:
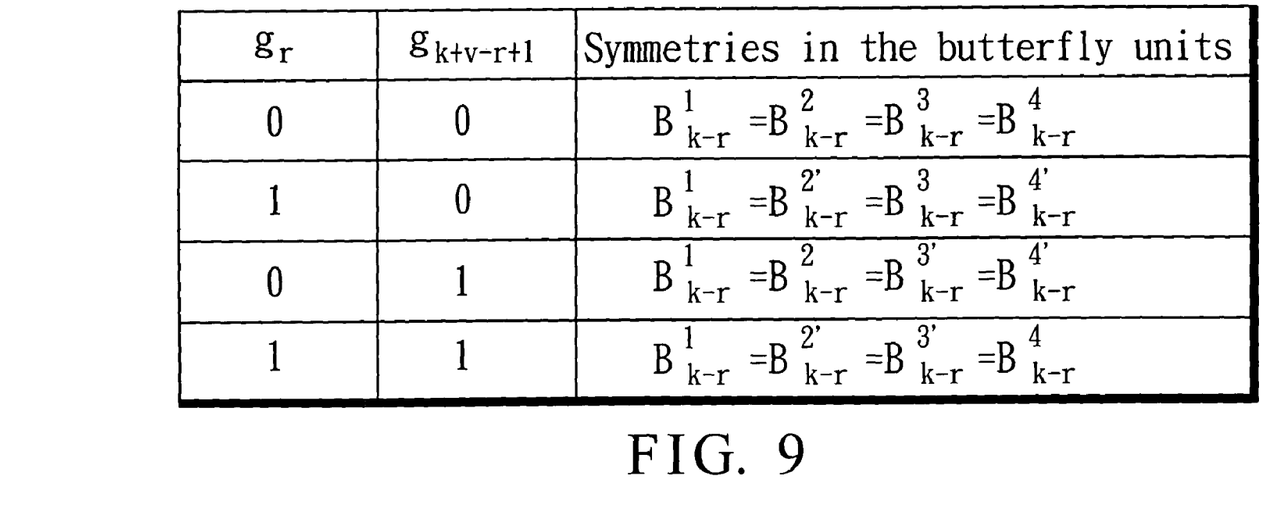
FIG. 9 is a table of a generator sequence and branch symmetries among the butterfly units in accordance with the invention.

When the relation of the four branches in the radix-$2^1$ butterfly unit is considered as four butterfly units {$B^1_0, B^2_0, B^3_0, B^4_0$} obtained by the k-th decomposition, it is known that the members of the generators influencing the symmetries in the levels have the same influence on the symmetries of the butterfly units in the levels, which can be generally shown in the table of FIG. 9. As shown in FIG. 9, no matter what the generator sequence is, the butterfly units in the levels can have ¼ symmetries. In the invention, the 1/x symmetry indicates that only one of the x branches is necessarily subjected to the branch metric computation, and in accordance with the symmetry, the branch metric values for the remaining (x−1) branches can be obtained. Therefore, the $(1/4)^k$ symmetry owned by the bits of each branch can be found by means of such a butterfly structure. It is noted that such a symmetry only indicates the symmetry owned by a single bit of the branches in the butterfly units in the levels. The complete symmetry of the branches is obtained by intersecting the symmetries of the bits corresponding to the branches. Thus, the branch symmetry is influenced by the similarity of bit symmetries. The bits of the branches have more similar symmetry, and the symmetry of the branches in the trellis diagram is more preferred.

Figure 10:
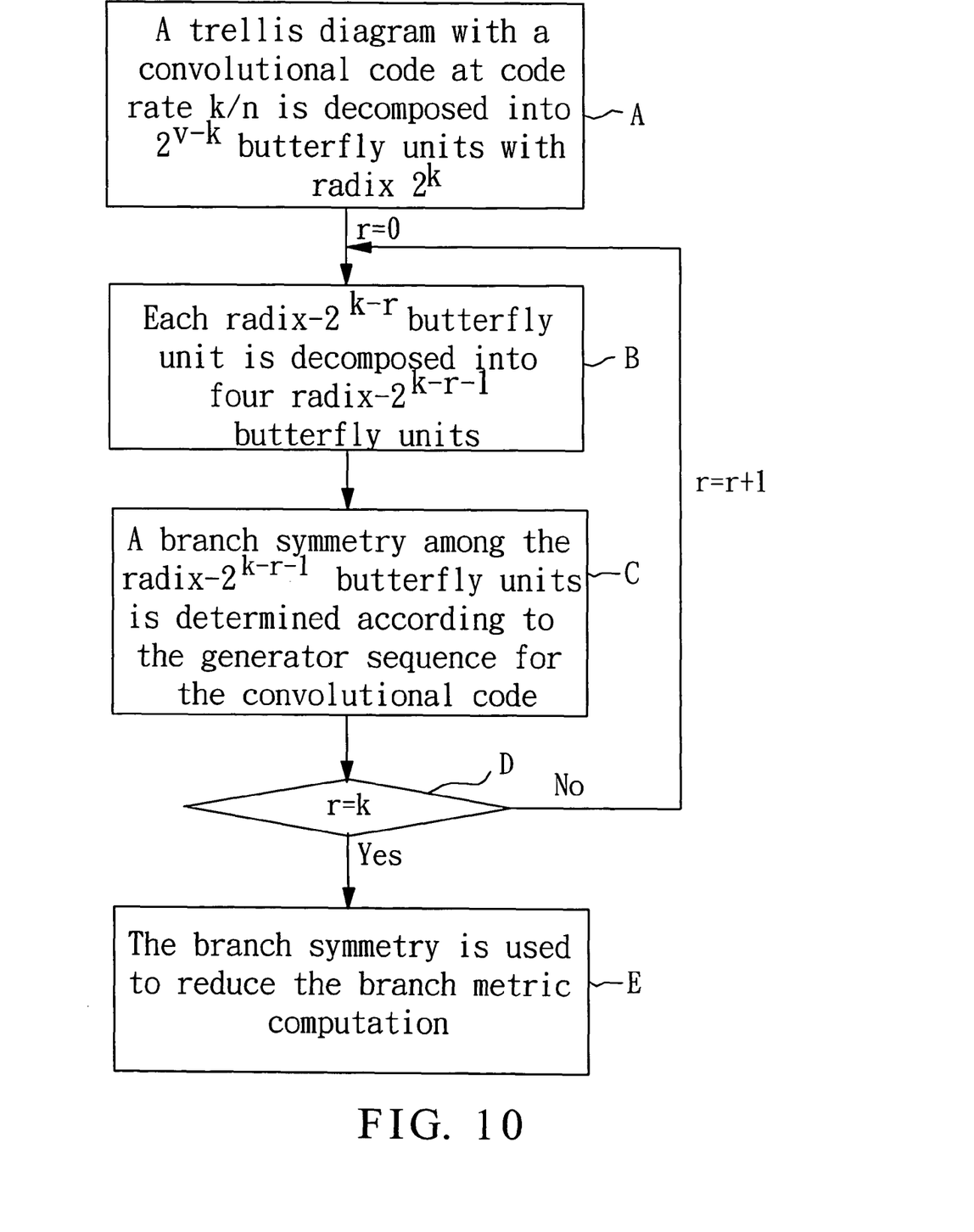
FIG. 10 is a flowchart of a method for reducing the computational complexity of a Viterbi decoder in accordance with the invention.

FIG. 10 is a flowchart of a method for reducing the computational complexity of a Viterbi decoder in accordance with the invention. The method includes the steps as follows.

Step A: a trellis diagram with a convolutional code at code rate k/n is decomposed into $2^{v-k}$ butterfly units with radix-$2^k$. Each butterfly unit, as shown in FIG. 3, has $2^k$ states, and each state joins $2^k$ branches. The values of the states contain a same portion $s_1 \ldots s_{v-k}$ to thereby distribute the corresponding branches to a same radix-$2^k$ butterfly unit.

Step B: each radix-$2^{k-r}$ butterfly unit is decomposed into four radix-$2^{k-r-1}$ butterfly units in order to reduce the influence of the generators on the branch symmetries.

Step C: each bit symmetry is determined in accordance with the generators for the convolutional code, and the bit symmetries respectively of the n bits are intersected to thus obtain the branch symmetry of the four radix-$2^{k-r-1}$ butterfly units.

Step D: it determines if r=k; when r is not equal to k, it indicates that a single radix-$2^{k-r-1}$ butterfly unit can be further decomposed. Namely, a symmetry among the radix-$2^{k-r}$ butterfly units is determined only by the members $(g_r^i, g_{k+v-r+1}^i)$ of the generators corresponding to the bits $(u_r, s_{v-r+1})$. In this case, r=r+1, and step B is executed for the further butterfly unit decomposition. When r=k, it indicates that the last level is decomposed completely.

Step E: the branch symmetry is used to reduce the branch metric computation required for decoding the convolutional code at the code rate k/n.

Figure 11:
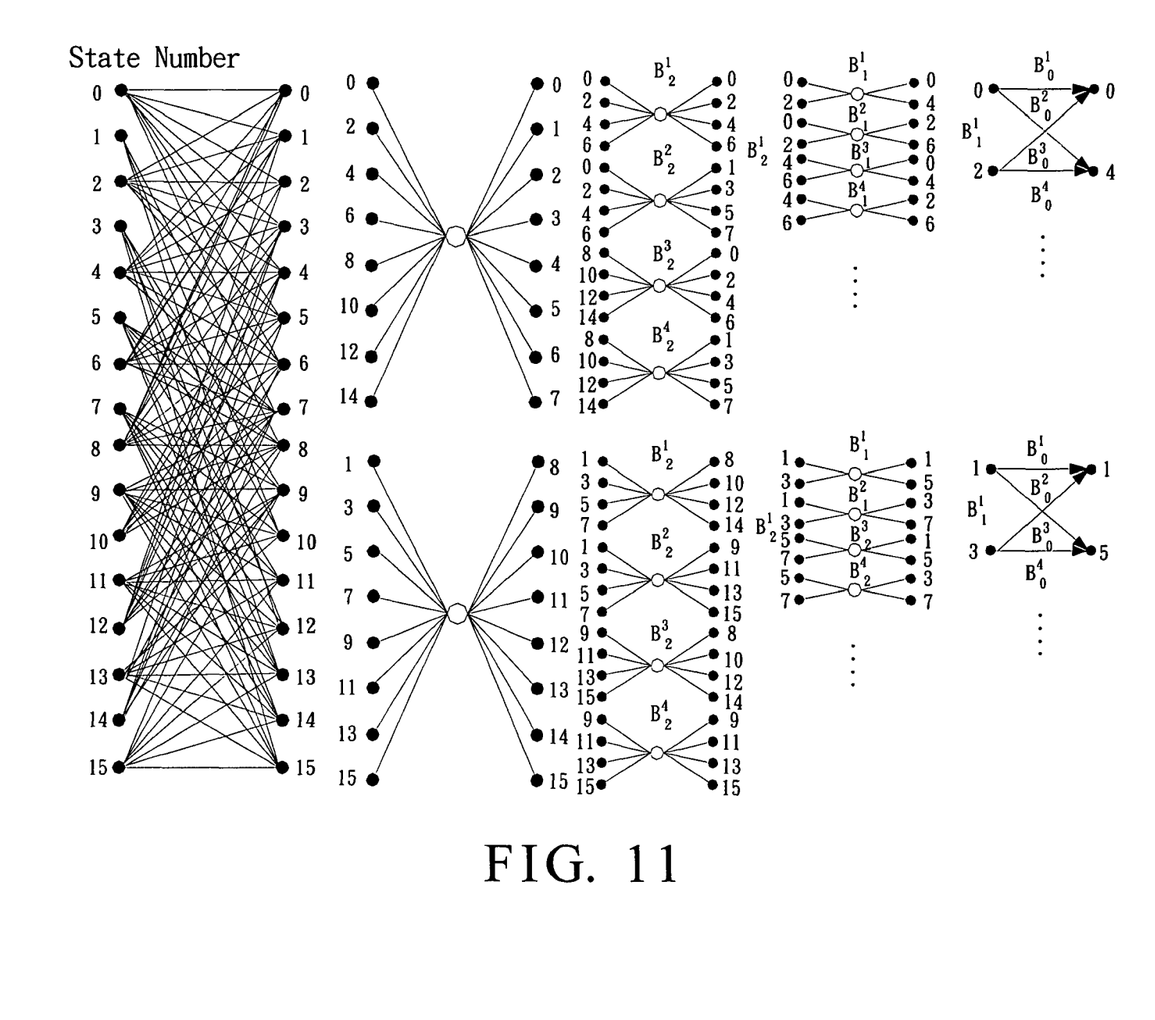
FIG. 11 is a schematic trellis diagram obtained by applying the method of FIG. 10 to an example of code rate k/n=¾ and constraint length v=4 for decomposition in accordance with the invention.

FIG. 11 is a schematic trellis diagram obtained by applying the method of FIG. 10 to an example of code rate k/n=3/4 and constraint length v=4 for decomposition in accordance with the invention. As shown in FIG. 11, a trellis diagram corresponding to the convolutional code at state set j has 16 state values numbered 0-15 in total. Each of the state values has eight state value transitions. The trellis diagram can be divided into two radix-$2^3$ butterfly units. Each butterfly unit has eight state values, and each state value has four state value transitions. Accordingly, if the generators are $g^1$=[1111101], $g^2$=[1111001], $g^3$=[1010111] and $g^4$=[1110101], when r=1, the bit symmetries among the radix-$2^{k-1}$ butterfly units are shown as follows.

Bit $y_1$ ($g_1^1$=1, $g_7^1$=1): $B_2^1 = B_2^{2'} = B_2^{3'} = B_2^4$;
Bit $y_2$ ($g_1^2$=1, $g_7^2$=1): $B_2^1 = B_2^{2'} = B_2^{3'} = B_2^4$;
Bit $y_3$ ($g_1^3$=1, $g_7^3$=1): $B_2^1 = B_2^{2'} = B_2^{3'} = B_2^4$; and
Bit $y_4$ ($g_1^4$=1, $g_7^4$=1): $B_2^1 = B_2^{2'} = B_2^{3'} = B_2^4$.

The four bits have the same symmetry so that the branch symmetry $B_2^1 = B_2^{2'} = B_2^{3'} = B_2^4$ is obtained by intersecting the bit symmetries. When r=2, the bit symmetries among the radix-$2^{k-2}$ butterfly units are shown as follows.

Bit ($g_2^1$=1, $g_6^1$=0): $B_1^1 = B_1^{2'} = B_1^3 = B_1^{4'}$;
Bit ($g_2^2$=1, $g_6^2$=0): $B_1^1 = B_1^{2'} = B_1^3 = B_1^{4'}$;
Bit ($g_2^3$=0, $g_6^3$=1): $B_1^1 = B_1^2 = B_1^{3'} = B_1^{4'}$; and
Bit $y_4$ ($g_2^4$=1, $g_6^4$=0): $B_1^1 = B_1^{2'} = B_1^3 = B_1^{4'}$.

The four bits have different symmetries so that only the branch symmetry $B_1^1 = B_1^{4'}$, $B_1^2 = B_1^{3'}$ is obtained after the intersection. When r=3, the bit symmetries among the radix-$2^{k-3}$ butterfly units are shown as follows.

Bit $y_1$ ($g_3^1$=1, $g_5^1$=0): $B_0^1 = B_0^{2'} = B_0^{3'} = B_0^4$;
Bit $y_2$ ($g_3^2$=1, $g_5^2$=0): $B_0^1 = B_0^{2'} = B_0^3 = B_0^{4'}$;
Bit $y_3$ ($g_3^3$=0, $g_5^3$=1): $B_0^1 = B_0^{2'} = B_0^3 = B_0^{4'}$; and
Bit $y_4$ ($g_3^4$=1, $g_5^4$=0): $B_0^1 = B_0^{2'} = B_0^{3'} = B_0^4$.

The four bits have different symmetries so that only the branch symmetry $B_0^1 = B_0^{2'}$, $B_0^3 = B_0^{4'}$ is obtained after the intersection.

The branch symmetries owned by the butterfly units in the three levels are combined so as to provide the convolutional code with a 1/16 symmetry. Accordingly, on implementing a Viterbi decoder with the convolutional code, the required branch metric computation is reduced by the butterfly structure to 1/16 of the original computation, and the remaining can be obtained in accordance with the branch symmetries. For example, as shown in FIG. 11, the trellis diagram has 16 states in total, each state having eight branches, and in this case, it is required that total 128 branch metric values are originally computed for every level of the trellis diagram. Accordingly, the invention uses the decomposition of the butterfly structure to first divide the trellis diagram into two radix-$2^3$ butterfly units. The four radix-$2^2$ butterfly units contained in each radix-$2^3$ butterfly units needs only to compute the branch metric values of the branch $B_2^1$, the others can be obtained through the symmetry $B_2^1 = B_2^{2'} = B_2^{3'} = B_2^4$. In addition, as to the branch $B_2^1$, only the branches $B_1^1$ and $B_1^3$ in the radix-2 butterfly unit are computed, without computing all branch metric values of the branch $B_2^1$, and the remaining can be obtained through the symmetry $B_1^1 = B_1^{4'}$, $B_1^2 = B_1^{3'}$. Similarly, as to the branches $B_1^1$ and $B_1^3$, only the branches $B_0^1$ and $B_0^3$ in the radix-1 butterfly unit are computed, and the remaining can be obtained through the symmetry $B_0^1 = B_0^{2'}$, $B_0^3 = B_0^{4'}$. Therefore, the entire radix-$2^3$ butterfly unit has 64 branches, but only four branches, i.e., $B_0^1$ and $B_0^3$ corresponding to the branches $B_1^1$ and $B_1^3$ respectively, are computed. Accordingly, the branch metric computation can be effectively reduced to 1/16 of the original. Likewise, the computation is performed on the other radix-$2^3$ butterfly unit.

In view of the foregoing, it is known that the method of the invention for reducing the computational complexity of a Viterbi decoder can effectively reduce the complexity of decoding the convolutional code at the code rate k/n, thereby achieving the purpose of the invention.

Although the present invention has been explained in relation to its preferred embodiment, it is to be understood that many other possible modifications and variations can be made without departing from the spirit and scope of the invention as hereinafter claimed.

What is claimed is:

1. A method for reducing the computational complexity of a Viterbi decoder included in a channel decoder of a receiver in a communication system, comprising the steps of:

(A) decomposing a trellis diagram with a convolutional code at a code rate k/n into $2^{v-k}$ radix-$2^k$ butterfly units, where k, n, v are positive integers, and k indicates a number of input bits, n indicates a number of output bits, and v indicates a constraint length;

(B) for a butterfly unit in the r-th level, decomposing each radix-$2^{k-r}$ butterfly unit into four radix-$2^{k-r-1}$ butterfly units;

(C) determining a branch symmetry among the radix-$2^{k-r-1}$ butterfly units based on a generator sequence for the convolutional code;

(D) determining if r is equal to k, and when r is not equal to k, adding one to r and executing step (B); and (E) using the branch symmetry to reduce a branch metric computation required by a convolutional decoding at the code rate k/n, wherein steps (A) to (E) are performed by said receiver.

2. The method as claimed in claim 1, wherein in step (C) the branch symmetry is obtained by intersecting bit symmetries, and each bit symmetry is determined in accordance with the generator sequence for the convolutional code.

* * * * *